(12) United States Patent
Ko et al.

(10) Patent No.: US 12,073,904 B2
(45) Date of Patent: Aug. 27, 2024

(54) STORAGE CONTROLLER INCLUDING PARITY MANAGEMENT MODULE, STORAGE DEVICE INCLUDING THE SAME, AND OPERATING METHOD OF STORAGE DEVICE

(71) Applicant: SAMSUNG ELECTRONICS CO., LTD., Suwon-si (KR)

(72) Inventors: Sanggyu Ko, Suwon-si (KR); Yeongmin Yoo, Guri-si (KR); Jongpil Kim, Gwangju (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 17/888,191

(22) Filed: Aug. 15, 2022

(65) Prior Publication Data

US 2023/0197183 A1 Jun. 22, 2023

(30) Foreign Application Priority Data

Dec. 21, 2021 (KR) .......................... 10-2021-0183923

(51) Int. Cl.
 *G11C 29/52* (2006.01)
 *G11C 16/10* (2006.01)
 *G11C 16/34* (2006.01)

(52) U.S. Cl.
 CPC ............ *G11C 29/52* (2013.01); *G11C 16/102* (2013.01); *G11C 16/3495* (2013.01)

(58) Field of Classification Search
 CPC ...... G11C 29/52; G11C 16/102; G11C 6/3495
 See application file for complete search history.

(56) References Cited

U.S. PATENT DOCUMENTS

| | | | |
|---|---|---|---|
| 8,189,386 B2 | 5/2012 | Park et al. | |
| 9,425,828 B2 | 8/2016 | Seo et al. | |
| 10,061,641 B2 | 8/2018 | Kim et al. | |
| 10,360,100 B2 | 7/2019 | Noguchi et al. | |
| 10,672,497 B2 | 6/2020 | Cai et al. | |
| 10,740,226 B2 | 8/2020 | Jo et al. | |
| 2007/0130438 A1* | 6/2007 | Marr .................... | G06F 9/3879 |
| | | | 711/168 |
| 2013/0138870 A1 | 5/2013 | Yoon et al. | |
| 2019/0206508 A1 | 7/2019 | Choi | |
| 2020/0210282 A1* | 7/2020 | Cariello ............... | G06F 11/108 |

FOREIGN PATENT DOCUMENTS

KR 10-2019-0083508 A 7/2019

* cited by examiner

*Primary Examiner* — Han Yang
(74) *Attorney, Agent, or Firm* — Sughrue Mion, PLLC

(57) ABSTRACT

An operating method of a storage controller which communicates with a non-volatile memory device is provided. The method includes determining whether a program/erase (P/E) count of a target page including a plurality of sectors is greater than or equal to a P/E threshold value; based on determining that the P/E count of the target page is greater than or equal to the P/E threshold value, fetching the target page; determining a first sector having high reliability and a second sector having low reliability from the plurality of sectors of the fetched target page; and expanding a second parity area of the second sector by moving a margin region in a first parity area of the first sector to the second parity area of the second sector.

20 Claims, 9 Drawing Sheets

STORAGE CONTROLLER INCLUDING PARITY MANAGEMENT MODULE, STORAGE DEVICE INCLUDING THE SAME, AND OPERATING METHOD OF STORAGE DEVICE

CROSS-REFERENCE TO RELATED APPLICATIONS

This application claims priority under 35 U.S.C. § 119 to Korean Patent Application No. 10-2021-0183923 filed on Dec. 21, 2021, in the Korean Intellectual Property Office, the disclosure of which is incorporated by reference herein in its entirety.

BACKGROUND

Embodiments of the present disclosure described herein relate to a storage controller, and more particularly, relate to a storage controller expanding a parity area of a non-volatile memory device.

As memory cells of a storage device are gradually miniaturized and are stacked, the memory cells are being degraded, and the endurance of the memory cells is decreasing. Also, as the number of bits stored per memory cell increases, the endurance of the memory cells is further problematic. Due to these issues, parity bits that are based on an error correction code may be used to correct an error that occurs in data stored in a memory cell. As the size of a parity area in which parity bits are stored increases, the error correction capability may be improved.

In other words, it may be possible to again use the reliability-reduced memory cells by increasing the size of the parity area of the reliability-reduced memory cells. Accordingly, there is required a technology for improving the error correction capability and reusing the reliability-reduced memory cells by increasing the size of the parity area of the reliability-reduced memory cells.

SUMMARY

Example embodiments of the present disclosure provide a storage controller including a parity management module, a storage device including the same, and an operation method of the storage device.

According to an aspect of an example embodiment, there is provided a method of operating a storage controller which communicates with a non-volatile memory device, the method including: determining whether a program/erase (P/E) count of a target page including a plurality of sectors is greater than or equal to a P/E threshold value; based on determining that the P/E count of the target page is greater than or equal to the P/E threshold value, fetching the target page; determining a first sector having high reliability and a second sector having low reliability from the plurality of sectors of the fetched target page; and expanding a second parity area of the second sector by moving a margin region in a first parity area of the first sector to the second parity area of the second sector.

According to an aspect of an example embodiment, there is provided a method of operating a storage device which includes a non-volatile memory device and a storage controller, the method including: determining, by the storage controller, whether a program/erase (P/E) count of a target page including a plurality of sectors is greater than or equal to a P/E threshold value; based on determining that the P/E count of the target page is greater than or equal to the P/E threshold value, transmitting, by the storage controller, a fetch request for the target page to the non-volatile memory device; based on receiving the fetch request, fetching, by the non-volatile memory device, the target page to the storage controller; determining, by the storage controller, a first sector of having high reliability and a second sector having low reliability from the plurality of sectors of the target page that has been fetched; and expanding, by the storage controller, a second parity area of the second sector by moving a margin region in a first parity area of the first sector to the second parity area of the second sector.

According to an aspect of an example embodiment, there is provided a storage device including: a non-volatile memory device configured to store a plurality of pages; an error correction code (ECC) engine configured to perform error correction of the plurality of pages; a count table configured to manage program/erase (P/E) counts respectively corresponding to the plurality of pages; and a parity management module configured to assist the error correction of the ECC engine based on the plurality of P/E counts, wherein the parity management module is configured to: determine whether a target P/E count corresponding to a target page is greater than or equal to a target P/E threshold value, with reference to the count table; based on determining that the P/E count of the target page is greater than or equal to the P/E threshold value, fetch the target page from the non-volatile memory device; determine a first sector having high reliability and a second sector having low reliability from a plurality of sectors of the fetched target page; based on determining the first sector having the high reliability and the second sector having the low reliability, expand a second parity area of the second sector by moving a margin region in a first parity area of the first sector to the second parity area of the second sector; and request the ECC engine to decode the target page in which the second parity area is expanded.

BRIEF DESCRIPTION OF THE FIGURES

The above and other aspects and features of the present disclosure will become apparent by describing in detail example embodiments thereof with reference to the accompanying drawings.

DETAILED DESCRIPTION

Below, example embodiments of the present disclosure will be described in detail and clearly to such an extent that one skilled in the art easily carries out the present disclosure. With regard to the description of the present disclosure, to make the overall understanding easy, like components will be marked by like reference signs/numerals in drawings, and thus, additional description will be omitted to avoid redundancy.

Figure 1:
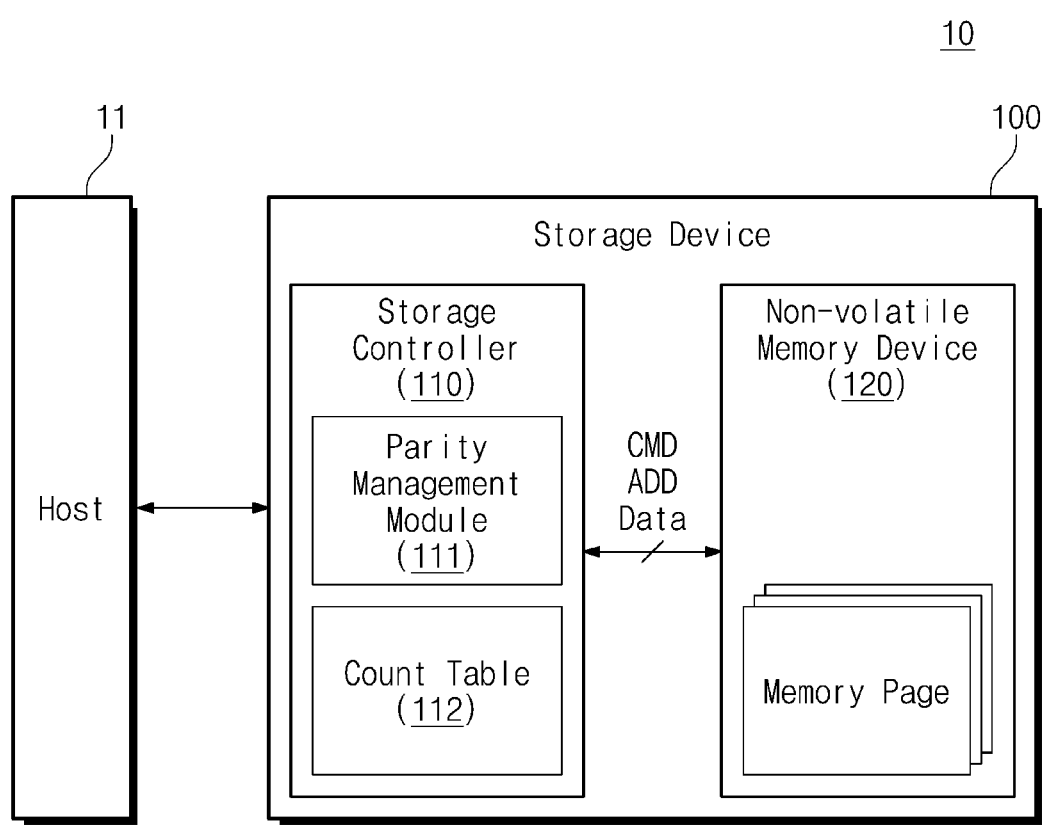
FIG. 1 is a block diagram of a storage system according to an example embodiment of the present disclosure.

FIG. 1 is a block diagram of a storage system according to an example embodiment of the present disclosure. Referring to FIG. 1, a storage system 10 may include a host 11 and a storage device 100. In some example embodiments, the storage system 10 may include a computing system, which is configured to process a variety of information, such as a personal computer (PC), a notebook, a laptop, a server, a workstation, a tablet PC, a smartphone, a digital camera, and a black box.

The host 11 may control an overall operation of the storage system 10. For example, the host 11 may store data in the storage device 100 or may read data stored in the storage device 100.

The storage device 100 may include a storage controller 110 and a non-volatile memory device 120. The storage controller 110 may store data in the non-volatile memory device 120 or may read data stored in the non-volatile memory device 120.

The storage controller 110 may include a parity management module 111 and a count table 112. The parity management module 111 may perform a parity management operation on a target page of a plurality of memory pages stored in the non-volatile memory device 120 with reference to the count table 112. The target page may refer to a memory page targeted for the parity management operation from among the memory pages. The parity management operation may refer to an operation of expanding a parity area of a sector having low reliability from among a plurality of sectors of the target page. The parity management operation will be described in detail with reference to FIG. 3 together.

The count table 112 may store program/erase counts of the plurality of memory pages of the non-volatile memory device 120. The P/E counts of the corresponding memory page may refer to the number of program/erase operations performed in the corresponding memory page.

The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

The non-volatile memory device 120 may include the plurality of memory pages. Each of the plurality of memory pages may be a unit of a read operation, a program operation, an erase operation, and a parity management operation. Each of the plurality of memory pages may include a plurality of sectors. Each of the plurality of sectors may include a data area and a parity area. Parity bits for error correction may be stored in the parity area.

In some example embodiments, the non-volatile memory device 120 may be a NAND flash memory device, but the present disclosure is not limited thereto. For example, the non-volatile memory device 120 may be one of various storage devices, which retain data stored therein even though a power is turned off, such as a phase-change random access memory (PRAM), a magnetic random access memory (MRAM), a resistive random access memory (RRAM), and a ferroelectric random access memory (FRAM).

Figure 2:
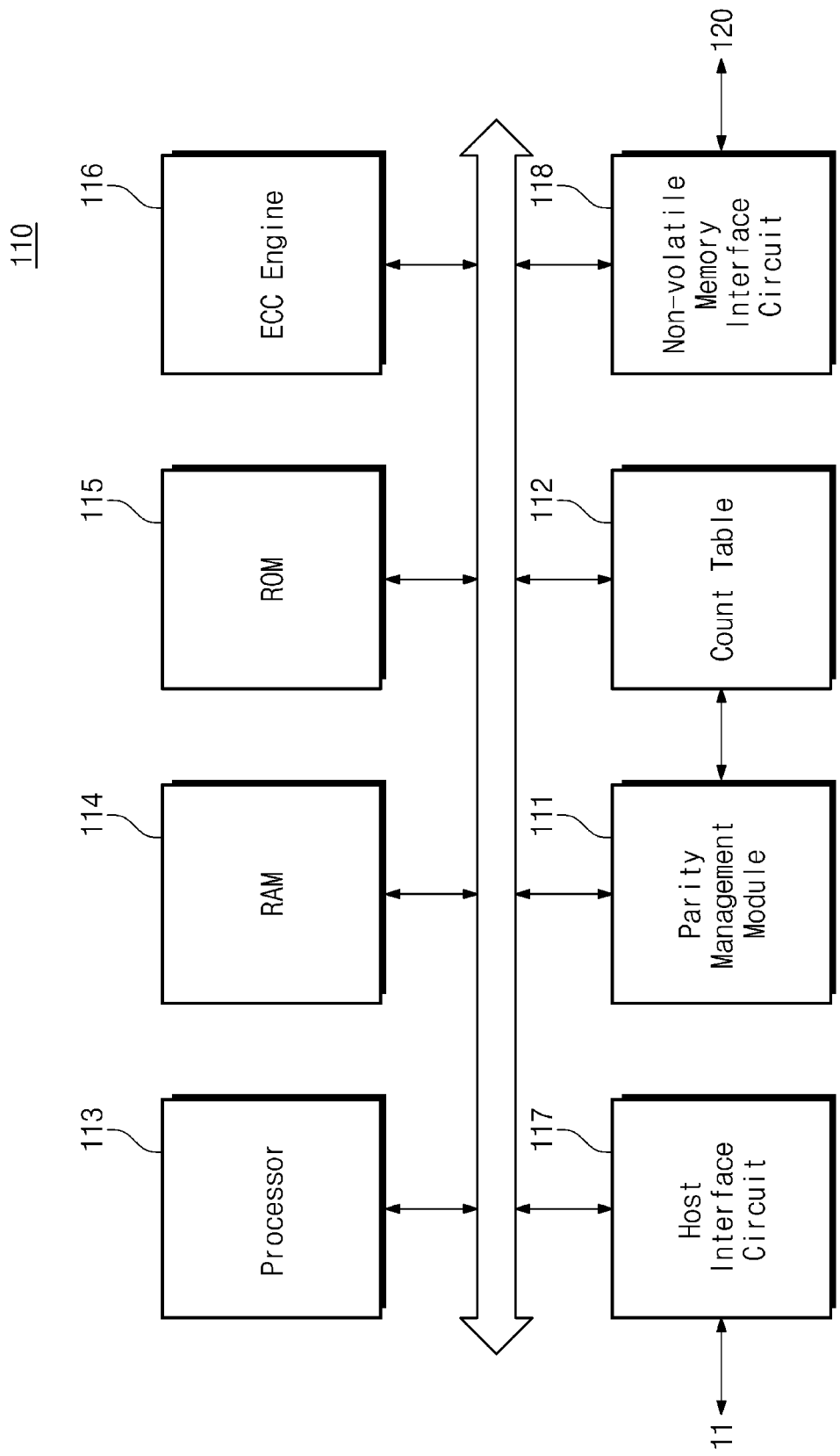
FIG. 2 is a block diagram illustrating a storage controller of FIG. 1 in detail, according to some example embodiments of the present disclosure.

FIG. 2 is a block diagram illustrating a storage controller of FIG. 1 in detail, according to some example embodiments of the present disclosure. Referring to FIGS. 1 and 2, the storage controller 110 may communicate with the host 11 and the non-volatile memory device 120. The storage controller 110 may include the parity management module 111, the count table 112, a processor 113, a random access memory (RAM) 114, a read only memory (ROM) 115, an error correcting code (ECC) engine 116, a host interface circuit 117, and a non-volatile memory interface circuit 118. The parity management module 111 and the count table 112 are similar to the parity management module 111 and the count table 112 of FIG. 1, and thus, additional description will be omitted to avoid redundancy.

In some example embodiments, the storage controller 110 may include a firmware memory. The firmware memory may store a variety of information, which is necessary for the storage controller 110 to operate, in the form of instructions.

The processor 113 may control overall operations of the storage controller 110. The RAM 114 may be used as a buffer memory, a cache memory, or a working memory of the storage controller 110. In some example embodiments, the RAM 114 may include a static random access memory (SRAM) or a dynamic random access memory (DRAM). The ROM 115 may be used as a read only memory that stores information necessary for the operation of the storage controller 110.

The ECC engine 116 may detect and correct an error of data read from the non-volatile memory device 120. The ECC engine 116 may process data having an error level (e.g., the number of flipped bits) exceeding the error correction capability as an uncorrectable error.

The ECC engine 116 may encode data received from the host 11 by using an error correction code (ECC) operation. The ECC engine 116 may create a parity area corresponding to the data depending on the ECC operation. That is, through the encoding operation, the ECC engine 116 may generate a sector including a data area and a parity area from the data depending on a request of a host and may store the sector in the non-volatile memory device 120.

The ECC engine 116 may correct an error included in a sector received from the non-volatile memory device 120 (i.e., may perform decoding on the sector). According to the decoding operation, with reference to the parity area, the ECC engine 116 may detect an error of the data area or may correct a detected error.

As the parity management module 111 expands a parity area of a sector having low reliability through the parity management operation, the ECC engine 116 may correct an error included in the sector having the low reliability. That is, the parity management module 111 may assist the error correction operation of the ECC engine 116.

The storage controller 110 may communicate with the host 11 through the host interface circuit 117. In some example embodiments, the host interface circuit 117 may be implemented based on at least one of various interfaces such as a serial ATA (SATA) interface, a peripheral component interconnect express (PCIe) interface, a serial attached SCSI (SAS) interface, a nonvolatile memory express (NVMe) interface, and an universal flash storage (UFS) interface.

The storage controller 110 may communicate with the non-volatile memory device 120 through the non-volatile memory interface circuit 118. In some example embodiments, the non-volatile memory interface circuit 118 may be implemented based on a NAND interface.

Figure 3:
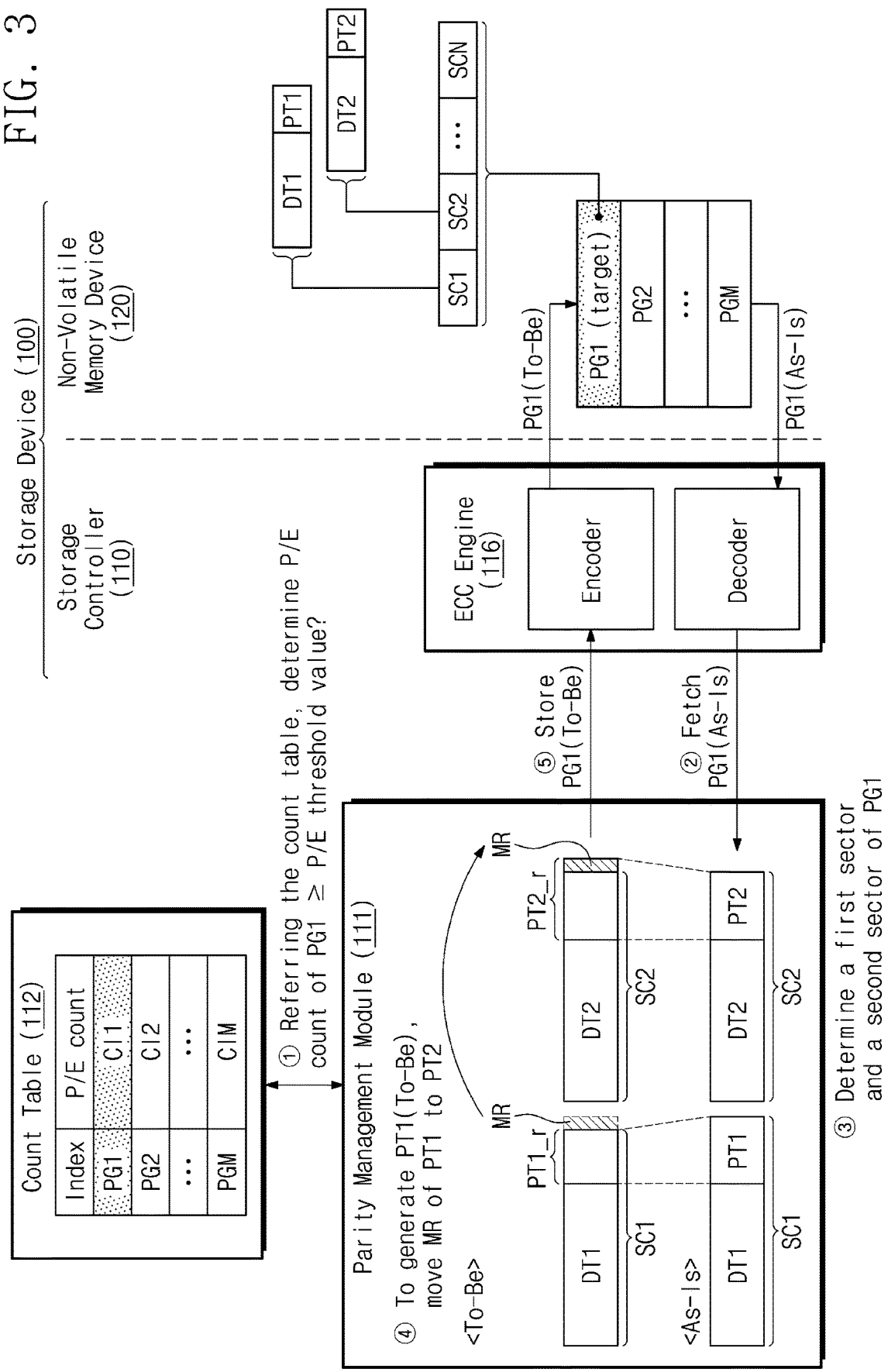
FIG. 3 is a diagram describing an operating method of a storage device of FIG. 1, according to some example embodiments of the present disclosure.

FIG. 3 is a diagram describing an operating method of a storage device according to some example embodiments of the present disclosure. Referring to FIG. 3, the storage device 100 may include the storage controller 110 and the non-volatile memory device 120. The storage device 100 may correspond to the storage device 100 of FIG. 1.

The storage controller 110 may perform the parity management operation for the non-volatile memory device 120. The storage controller 110 may include the parity management module 111, the count table 112, and the ECC engine 116. The parity management module 111, the count table 112, and the ECC engine 116 are similar to the parity management module 111, the count table 112, and the ECC engine 116 of FIG. 2, and thus, additional description will be omitted to avoid redundancy.

The count table 112 may store a plurality of program/erase (P/E) counts CI1, CI2, . . . CIM respectively corresponding to a plurality of memory pages PG1 to PGM of the non-volatile memory device 120. The plurality of P/E counts CI1 to CIM may be referred to as "first to M-th counts". Herein, "M" is a natural number. Each of the plurality of P/E counts CI1 to CIM may refer to the number of program/erase operations performed in the corresponding one of the plurality of memory pages PG1, PG2, . . . PGM. The plurality of memory pages PG1 to PGM may be referred to as "first to M-th pages". For example, the first P/E count CI1 may correspond to a sum of the number of program operations performed in the first page PG1 and the number of erase operations performed in the first page PG1.

The non-volatile memory device 120 may include the plurality of memory pages PG1 to PGM. Each of the plurality of memory pages PG1 to PGM may be a unit of a read operation, a program operation, an erase operation, and a parity management operation. Each of the plurality of memory pages PG1 to PGM may include a plurality of sectors SC1, SC2, . . . SCN. For example, the plurality of sectors SC1 to SCN may be referred to as "first to N-th sectors SC1 to SCN". Herein, "N" is a natural number.

Each of the plurality of sectors SC1 to SCN may include a data area and a parity area. Parity bits for error correction may be stored in the parity area. For example, the first sector SC1 may include a first data area DT1 and a first parity area PT1. The second sector SC2 may include a second data area DT2 and a second parity area PT2. The non-volatile memory device 120 is similar to the non-volatile memory device 120 of FIG. 2, and thus, additional description will be omitted to avoid redundancy.

Below, an operating method of the storage device 100 according to some example embodiments of the present disclosure will be described. In detail, a parity management operation of a target page will be performed based on the operating method of the storage device 100. Also, a target page before a parity area is changed by the parity management module 111 is marked by "As-Is", and a target page after a parity area is changed is marked by "To-Be".

In a first operation ①, the parity management module 111 may determine whether a P/E count of a target page is greater than or equal to a P/E threshold value, with reference to the count table 112. The P/E threshold value may refer to a criterion for determining the lifetime of the plurality of memory pages PG1 to PGM.

For example, the target page may be the first page PG1. The parity management module 111 may determine whether the P/E count CI1 of the first page PG1 is greater than or equal to the P/E threshold value, with reference to the count table 112. When the P/E count CI1 of the first page PG1 is smaller than the P/E threshold value, the parity management module 111 may determine that the reliability of the first page PG1 is secured. The parity management module 111 may not perform the parity management operation on the first page PG1 whose reliability is secured.

When the P/E count CI1 of the first page PG1 is greater than or equal to the P/E threshold value, the parity management module 111 may determine that the reliability of the first page PG1 is not secured. The parity management module 111 may perform the parity management operation on the first page PG1 whose reliability is not secured.

In a second operation ②, the ECC engine 116 may fetch a target page of the non-volatile memory device 120 under control of the parity management module 111. The ECC engine 116 may decode the fetched target page. For example, the target page may be the first page PG1.

In the second operation ② before a parity area is changed, the parity areas of the plurality of sectors SC1 to SCN belonging to the target page may be equal to each other in size. For example, before the parity area of the first page PG1 is changed, the first parity area PT1 of the first sector SC1 and the second parity area PT2 of the second sector SC2 may have the same size.

In a third operation ③, the parity management module 111 may determine the first sector SC1 of high reliability and the second sector SC2 of low reliability from among the plurality of sectors SC1 to SCN in the fetched target page. The first parity area PT1 of the first sector SC1 having high reliability may include a margin region MR. The margin region MR may be a spare region (or a reserved region) that is not used when an error verify operation is performed on the first sector SC1 of high reliability.

For example, the parity management module 111 may determine the first sector SC1 of high reliability and the second sector SC2 of low reliability from among the plurality of sectors SC1 to SCN in the first page PG1 thus fetched.

In some example embodiments, the parity management module 111 may determine the first sector SC1 of high reliability and the second sector SC2 of low reliability based on an off-cell count. The off-cell count may refer to the number of cells whose threshold voltages do not exceed a read voltage when the program operation is performed on a target page. This will be described in detail with reference to FIG. 5 together.

In some example embodiments, the parity management module 111 may determine the first sector SC1 of high reliability and the second sector SC2 of low reliability based on a loop count. The loop count may refer to the number of program loops that are performed to program threshold voltages of memory cells to a given value in compliance with the ISPP (Incremental Step Pulse Program) scheme. The loop count may be managed in units of sector.

In some example embodiments, whenever the program loop is performed, levels of threshold voltages of memory cells in a sector may gradually increase. The program loop may be repeated until the levels of the threshold voltages of the memory cells in the sector reach a verify voltage.

When the levels of the threshold voltages of the memory cells in the sector reach the verify voltage, the parity management module 111 may determine that the program operation is successfully completed. The program loop may include a program step in which a program voltage is applied, and a verify step in which a verification voltage is applied. That is, the program operation may be performed on a sector through the ISPP. This will be described in more detail with reference to FIG. 6.

Figure 6:
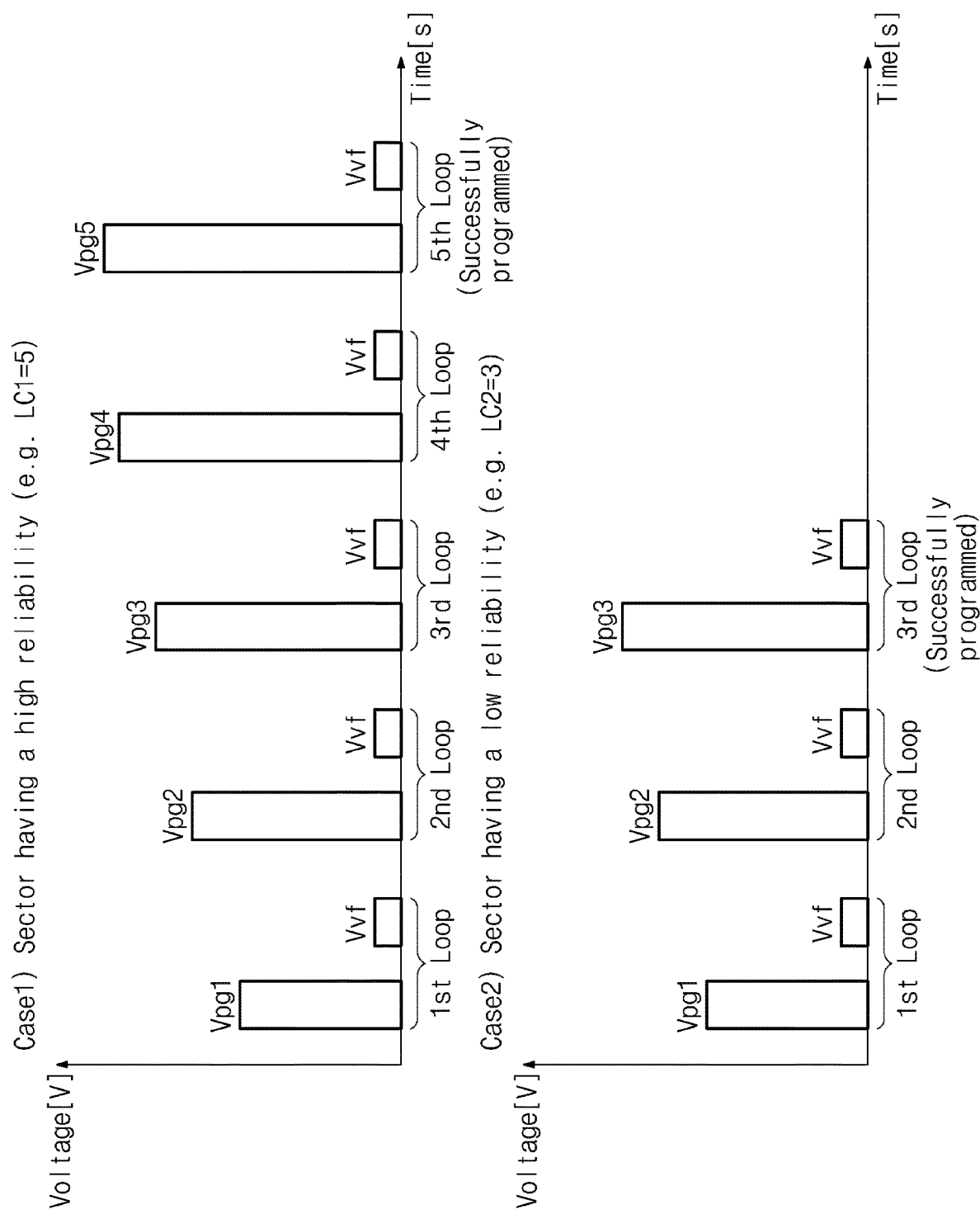
FIG. 6 is a graph describing an operation for determining reliability of a sector based on a loop count, according to some example embodiments of the present disclosure.

FIG. 6 illustrates a first case ("Case 1") of programming and verification voltages applied for a sector having high reliability. Each cycle is referred to as a loop. For Case 1, a first loop, second loop, third loop, fourth loop and fifth loop are illustrated. In this example, successively higher programming voltages are applied until the sector is successfully programmed after five loops.

FIG. 6 also illustrates a second case ("Case 2") of programming and verification voltages applied for a sector having low reliability. For Case 2, a first loop, second loop, and third loop are illustrated. In this example, successively higher programming voltages are applied until the sector is successfully programmed after three loops.

Further aspects of FIG. 6 are discussed further below.

Returning to FIG. 3, in a fourth operation ④, the parity management module 111 may move a margin region of the first parity area PT1 of the first sector SC1 having high reliability to the second parity area PT2 of the second sector SC2 having low reliability. As such, the parity management module 111 may generate a target page whose parity area is changed.

For example, the target page may be the first page PG1. The parity management module 111 may generate a target page whose parity area is changed, by moving the margin region of the first parity area PT1 of the first sector SC1 having high reliability to the second parity area PT2 of the second sector SC2 having low reliability.

In this case, in the target page whose parity area is changed, the size of the first parity area PT1 (indicated as PT1_r in FIG. 3) may be smaller than the size of the second parity area PT2 (indicated as PT2_r in FIG. 3). In other words, the first parity area PT1 of the target page whose parity area is changed may decrease as much as the margin region MR, and the second parity area PT2 of the target page whose parity area is changed may increase as much as the margin region MR.

As the parity management module 111 expands the second parity area PT2 of the second sector SC2 having low reliability, the reliability of the second sector SC2 may be improved. For example, when the second parity area PT2 of the second sector SC2 is expanded, the probability of uncorrectable error occurrence in the second sector SC2 may decrease.

In contrast, because the first sector SC1 having high reliability has already sufficient reliability, even though the first parity area PT1 decreases, the reliability of a given level may be guaranteed. That is, the reliability of the first page PG1 may be overall improved by rearranging parity areas of a target page. This may mean that the reliability of the storage device 100 is improved and the lifetime of the storage device 100 is prolonged.

In some example embodiments, when a P/E count of a target page exceeds a reference value, the parity management module 111 may move the margin region MR of the first parity area PT1 to the second parity area PT2. The reference value may correspond to a sum of the P/E threshold value and a variable parameter. The size of the margin region MR may be determined depending on the variable parameter. For example, as the variable parameter increases, the size of the margin region MR may increase. This will be described in detail with reference to FIG. 3 and FIG. 4.

In a fifth operation ⑤, the parity management module 111 may request encoding for a target page whose parity area is changed. The ECC engine 116 may encode the target page whose parity area is changed. The ECC engine 116 may request the non-volatile memory device 120 to store the encoded target page.

For example, the target page may be the first page PG1. The parity management module 111 may request encoding for the first page PG1 whose parity area is changed. The ECC engine 116 may encode the first page PG1 whose parity area is changed. The ECC engine 116 may request the non-volatile memory device 120 to store the first page PG1 thus encoded.

In some example embodiments, the parity management module 111 may repeatedly perform the parity management operation on the target page of the non-volatile memory device 120. Under control of the parity management module 111, the ECC engine 116 may again fetch the target page whose parity area is changed, from the non-volatile memory device 120. The ECC engine 116 may decode the target page again fetched. The parity management module 111 may determine the first sector SC1 of high reliability and the second sector SC2 of low reliability from among the plurality of sectors SC1 to SCN in the target page again fetched.

The parity management module 111 may move a margin region of the first parity area PT1 of the first sector SC1 of the target page again fetched, to the second parity area PT2 of the second sector SC2 of the target page again fetched. The parity management module 111 may request encoding for the target page whose parity area is again changed. The ECC engine 116 may encode the target page whose parity area is again changed.

The parity management module 111 may repeatedly perform the parity management operation on the target page until the target page of the non-volatile memory device 120 is set to a read-only mode. The read-only mode may refer to a mode in which a program operation or an erase operation is not performed on a memory page.

Figure 4:
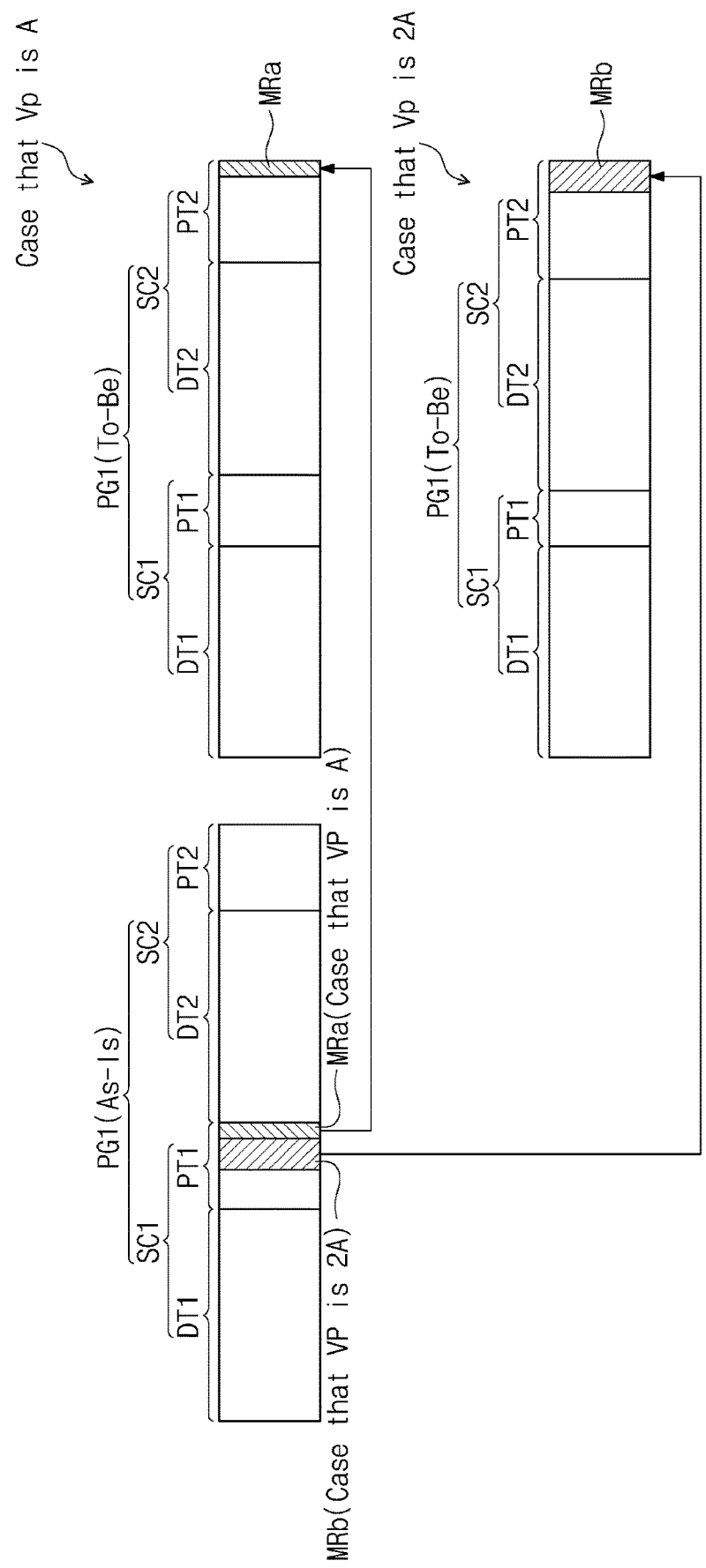
FIG. 4 is a diagram describing a margin region whose size is determined depending on a variable parameter.

FIG. 4 is a diagram describing a margin region whose size is determined depending on a variable parameter. FIG. 4 is a diagram describing a margin region whose size is determined depending on a variable parameter.

Referring to the first page PG1 before a parity area is changed, the first parity area PT1 including a first margin region MRa and a second margin region MRb is illustrated. The first margin region MRa may correspond to the case where a variable parameter VP is a first value A. The second margin region MRb may correspond to the case where the variable parameter VP is a second value 2A. In some example embodiments, when the second value 2A is two times the first value A, the size of the second margin region MRb may be two times the size of the first margin region MRa. That is, a size of a margin region may be determined depending on the variable parameter VP.

Referring to the first page PG1 including a changed parity area when the variable parameter VP is the first value A, the second parity area PT2 may increase as much as the first margin region MRa having the size corresponding to the first value A. That is, in the first page PG1 whose parity area is changed, the first parity area PT1 may decrease as much as the first margin region MRa, and the second parity area PT2 may increase as much as the first margin region MRa.

Referring to the first page PG1 including a changed parity area when the variable parameter VP is the second value 2A, the second parity area PT2 may increase as much as the second margin region MRb having the size corresponding to the second value 2A. That is, in the first page PG1 whose parity area is changed, the first parity area PT1 may decrease as much as the second margin region MRb, and the second parity area PT2 may increase as much as the second margin region MRb.

Figure 5:
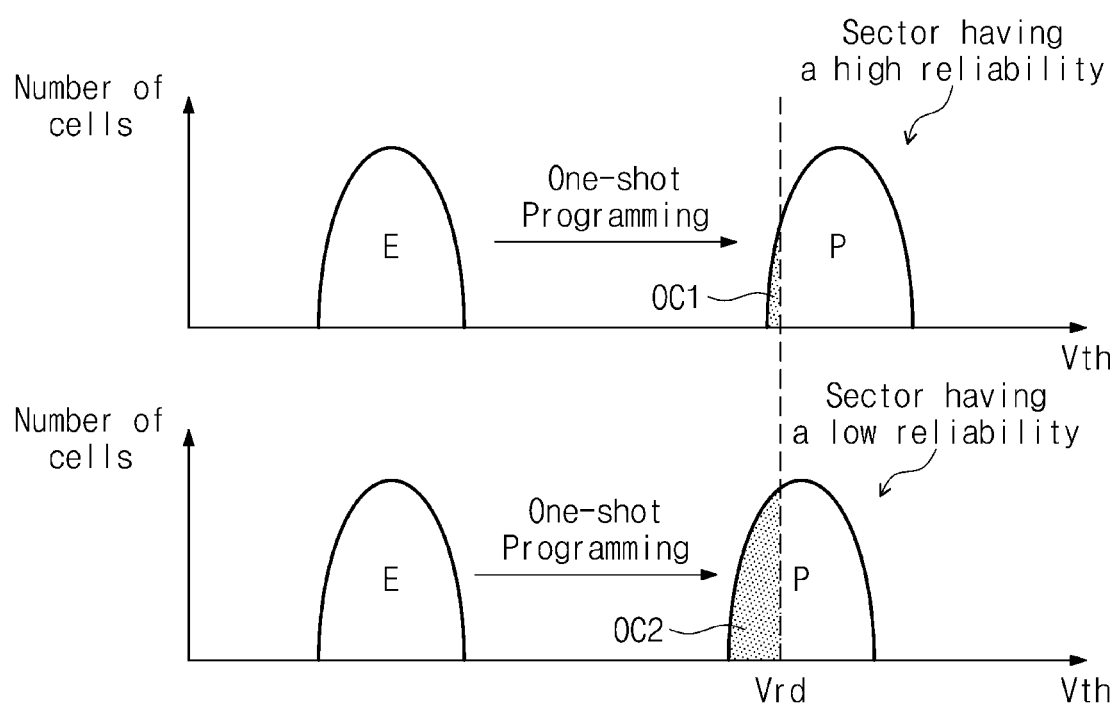
FIG. 5 is a graph describing an operation for determining reliability of a sector based on an off-cell count, according to some example embodiments of the present disclosure.

FIG. 5 is a graph describing an operation for determining reliability of a sector based on an off-cell count, according to some example embodiments of the present disclosure. An operation in which the parity management module 111 determines a sector of high reliability and a sector of low reliability depending on an off-cell count will be described with reference to FIGS. 3 and 5. In FIG. 5, a vertical axis represents the number of memory cells, and a horizontal axis represents a threshold voltage. A memory cell may have one of an erase state "E" and a programming state "P".

When it is determined that a P/E count of a target page is greater than or equal to the P/E threshold value, the parity management module 111 may perform one-shot programming on the target page. The one-shot programming may refer to a program operation in which a multi-bit capable of being stored in a multi-level cell is stored through one program cycle. For example, after the one-shot programming is performed on a target page, memory cells of the target page may have the erase state "E" or the programming state "P".

Afterwards, the parity management module 111 may read bit values of the memory cells of the target page based on a read voltage Vrd and may obtain an off-cell count. For example, memory cells determined as the erase state "E" based on the read voltage Vrd may be referred to as an "off-cell", and memory cells determined as the programming state "P" based on the read voltage Vrd may be referred to as an "on-cell". The off-cell count may refer to the number of off-cells among the memory cells included in the target page.

In some example embodiments, the parity management module 111 may obtain a plurality of off-cell counts respectively corresponding to a plurality of sectors in the target page. For example, when the target page includes a first sector and a second sector, the parity management module 111 may obtain a first off-cell count of the first sector and a second off-cell count of the second sector by performing the one-shot programming on the target page and then performing the read operation associated with the target page based on the read voltage Vrd.

The parity management module 111 may compare each of the plurality of off-cell counts with a count threshold value. The count threshold value may be used to determine whether the reliability of the first and second sectors is high or low. For example, when the off-cell count does not exceed the count threshold value, a sector corresponding to the off-cell count may have high reliability. When the off-cell count exceeds the count threshold value, the sector corresponding to the off-cell count may have low reliability.

In detail, referring to a graph associated with a sector having high reliability, a first off-cell region OC1 may include memory cells whose threshold voltages are less than or equal to the read voltage Vrd. A first off-cell count of a specific sector may refer to the number of memory cells included in the first off-cell region OC1. When the first off-cell count does not exceed the count threshold value, the parity management module 111 may determine that the specific sector has high reliability.

Referring to a graph associated with a sector having low reliability, a second off-cell region OC2 may include memory cells whose threshold voltages are less than or equal to the read voltage Vrd. A second off-cell count of a specific sector may refer to the number of memory cells included in the second off-cell region OC2. When the second off-cell count exceeds the count threshold value, the parity management module 111 may determine that the specific sector has low reliability.

When the second off-cell count exceeds a first discard threshold value, the parity management module 111 may set a page including the specific sector to a read-only mode. The parity management module 111 may not perform the parity management operation on the page set to the read-only mode. The first discard threshold value may be greater than the count threshold value.

FIG. 6 is a graph describing an operation for determining reliability of a sector based on a loop count, according to some example embodiments of the present disclosure. An operation in which the parity management module 111 determines a sector of high reliability and a sector of low reliability depending on a loop count will be described with reference to FIGS. 3 and 6. In FIG. 6, a vertical axis represents a voltage, and a horizontal axis represents a time.

The parity management module 111 may perform the ISPP on a target page depending on a program request of a host. The parity management module 111 may generate a plurality of loop counts respectively corresponding to a plurality of sectors by performing the ISPP on the target page. In some example embodiments, the count table 112 may store the plurality of loop counts respectively corresponding to the plurality of sectors.

Also, the parity management module 111 may update a P/E count of the target page by performing the ISPP on the target page. For example, as the parity management module 111 performs the ISPP on a target page whose P/E count is "5", the parity management module 111 may update the P/E count so as to be changed to "6".

The parity management module 111 may determine whether the updated P/E count of the target page is greater than or equal to a P/E threshold value. When the updated P/E count of the target page is greater than or equal to a P/E threshold value, the parity management module 111 may compare each of the plurality of loop counts with a loop threshold value. The loop threshold value may be used to determine whether the reliability of a sector is high or low. For example, when the loop count exceeds the loop threshold value, the sector corresponding to the loop count may have high reliability. When the loop count does not exceed the loop threshold value, the sector corresponding to the loop count may have low reliability.

Below, an operation for generating a first loop count corresponding to a sector of high reliability and a second loop count corresponding to a sector of low reliability will be described.

Referring to Case 1 corresponding to the sector of high reliability, first to fifth program loops are illustrated. In a program step of the first program loop, a first program voltage Vpg1 may be applied to memory cells of the sector. Threshold voltages of the memory cells may increase in response to the first program voltage Vpg1. After the program step, in a verify step of the first program loop, the parity management module 111 may determine whether the threshold voltages of the memory cells are greater than a verify voltage Vfy. When it is determined that the threshold voltages of the memory cells are not greater than the verify voltage Vfy, the parity management module 111 may perform the second program loop.

In a program step of the second program loop, a second program voltage Vpg2 may be applied to the memory cells. A level of the second program voltage Vpg2 may be higher than a level of the first program voltage Vpg1. The threshold voltages of the memory cells may increase in response to the second program voltage Vpg2. Afterwards, the program loop may be repeated until the threshold voltages of all the memory cells are greater than the verify voltage Vfy.

When the threshold voltages of all the memory cells are greater than the verify voltage Vfy, the parity management module 111 may determine that the sector is successfully programmed and may determine the number of performed program loops as a loop count. For example, in a verify step of the fifth program loop, when it is determined that the threshold voltages of all the memory cells are greater than the verify voltage Vfy, the parity management module 111 may determine the first loop count LC1 to be "5".

When the first loop count LC1 exceeds the loop threshold value, the parity management module 111 may determine that a sector corresponding to the first loop count LC1 has high reliability. For example, when the first loop count LC1 is "5" and the loop threshold value is "4", the parity management module 111 may determine that the corresponding sector has high reliability.

Referring to Case 2 corresponding to the sector of low reliability, first to third program loops are illustrated. In a verify step of the third program loop, when it is determined that the threshold voltages of all the memory cells are greater than the verify voltage Vfy, the parity management module 111 may determine a second loop count LC2 to be "3".

When the second loop count LC2 does not exceed the loop threshold value, the parity management module 111 may determine that a sector corresponding to the second loop count LC2 has low reliability. For example, when the second loop count LC2 is "3" and the loop threshold value is "4", the parity management module 111 may determine that the corresponding sector has low reliability.

In some example embodiments, when the second loop count LC2 is smaller than a second discard threshold value, the parity management module 111 may set a page including the corresponding sector to a read-only mode. The parity management module 111 may not perform the parity management operation on the page set to the read-only mode. The second discard threshold value may be smaller than the loop threshold value.

An example in which the first loop count LC1 of the sector having high reliability is "5" and the second loop count LC2 of the sector having low reliability is "3" is described with reference to FIG. 6. However, the present disclosure is not limited thereto.

Figure 7:
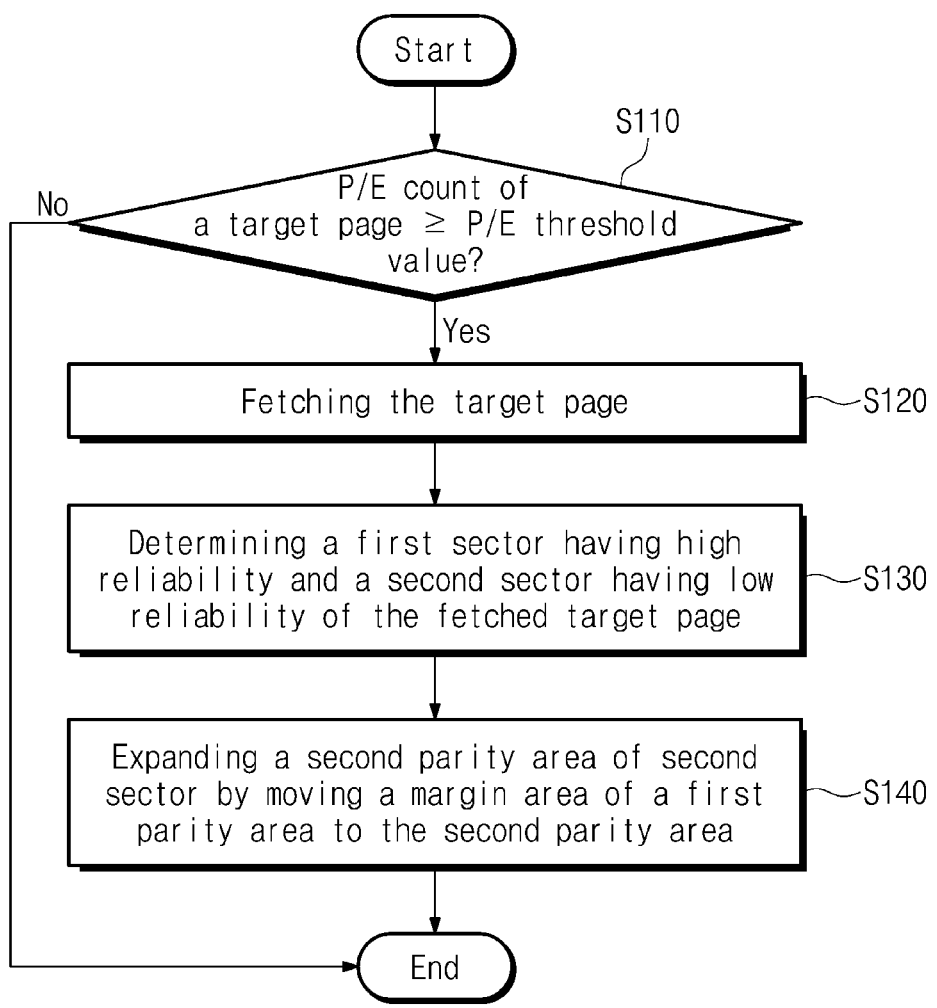
FIG. 7 is a flowchart describing an operation of a storage controller according to some example embodiments of the present disclosure.

FIG. 7 is a flowchart describing an operation of a storage controller according to some example embodiments of the present disclosure. An operating method of a storage controller according to some example embodiments of the present disclosure will be described with reference to FIG. 7. The storage controller may correspond to the storage controller 110 of FIGS. 1, 2, and 3.

In operation S110, the storage controller may determine whether a P/E count of a target page is greater than or equal to the P/E threshold value.

In operation S120, the storage controller may fetch the target page, based on determining that the P/E count of the target page is greater than or equal to the P/E threshold value.

In operation S130, the storage controller may determine a first sector of high reliability and a second sector of low reliability from a plurality of sectors of the fetched target page.

In some example embodiments, the storage controller may determine the first sector of high reliability and the second sector of low reliability based on a plurality of off-cell counts. This will be described in more detail with reference to FIG. 8.

In some example embodiments, the storage controller may determine the first sector of high reliability and the second sector of low reliability based on a plurality of loop counts. This will be described in detail with reference to FIG. 8 and FIG. 9.

In operation S140, the storage controller may move a margin region in a first parity area of the first sector to a second parity area of the second sector. As such, the storage controller may expand the second parity area of the second sector.

After expanding the second parity area of the second sector, the storage controller may again perform the parity management operation on the target page whose parity area is changed.

In some example embodiments, the storage controller may again fetch the target page whose parity area is changed. The storage controller may determine a first sector of high reliability and a second sector of low reliability from the plurality of sectors of the target page again fetched.

The storage controller may move a margin region of a first parity area of the first sector of the target page again fetched, to a second parity area of the second sector of the target page again fetched.

According to the above description, the storage controller may repeatedly perform the parity management operation on the target page until the target page is set to the read-only mode.

Figure 8:
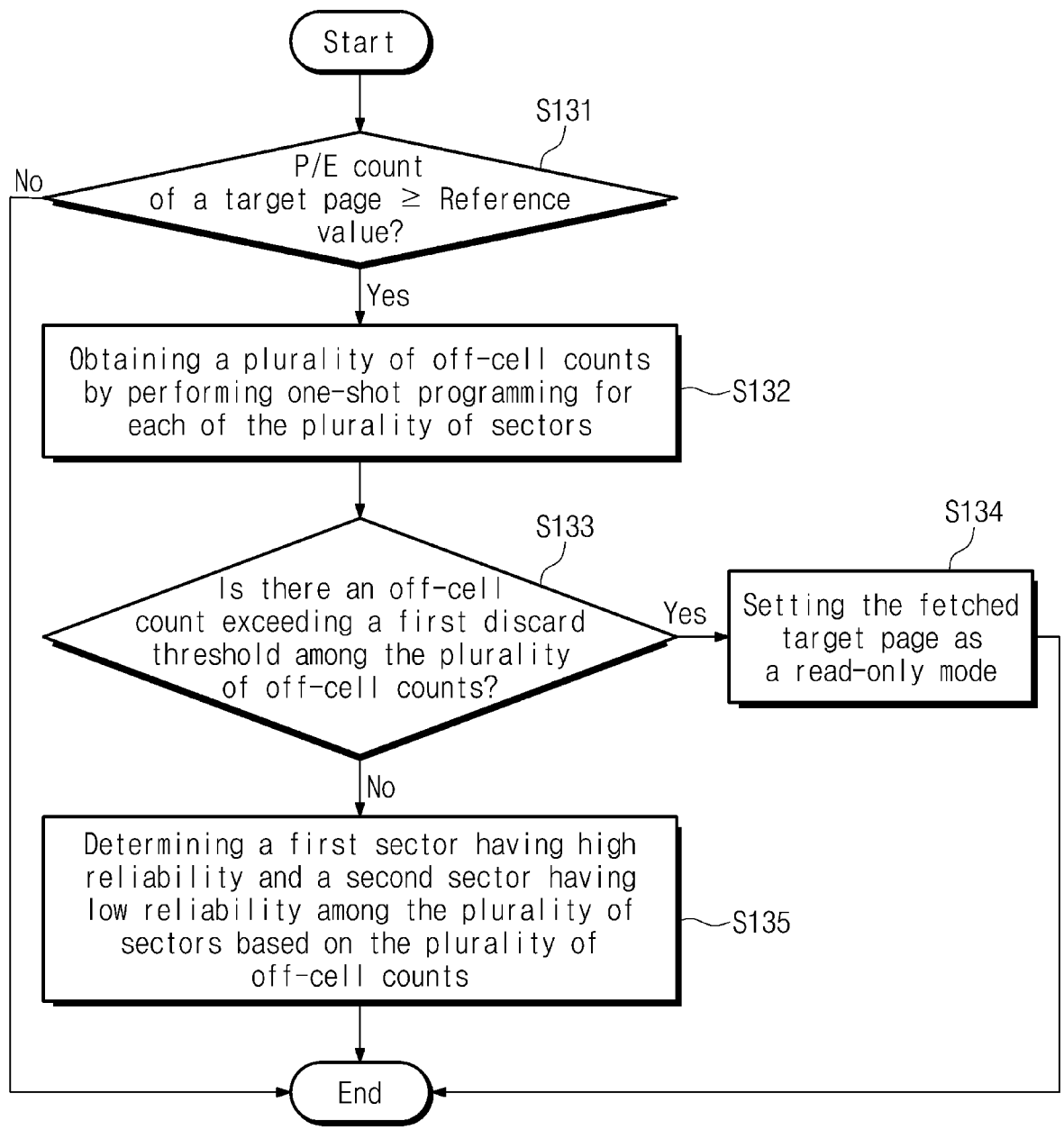
FIG. 8 is a flowchart describing an operation for determining reliability of a sector based on an off-cell count, according to some example embodiments of the present disclosure.

FIG. 8 is a flowchart describing an operation for determining reliability of a sector based on an off-cell count, according to some example embodiments of the present disclosure. An operating method of the storage controller according to some example embodiments of the present disclosure will be described with reference to FIG. 8. The flowchart of FIG. 8 illustrates operation S130 of the flowchart of FIG. 7, which is implemented according to some example embodiments. The storage controller may correspond to the storage controller 110 of FIGS. 1, 2, and 3.

In operation S131, the storage controller may determine whether a P/E count of a target page is greater than or equal to a reference value. When it is determined that the P/E count of the target page is greater than or equal to the reference value, the storage controller may perform operation S132. When it is determined that the P/E count of the target page is smaller than the reference value, the storage controller may not perform the parity management operation.

In operation S132, the storage controller may obtain a plurality of off-cell counts respectively corresponding to a plurality of sectors of the target page. In some example embodiments, the storage controller may obtain the plurality of off-cell counts respectively corresponding to the plurality of sectors of the target page by performing one-shot programming on the target page.

In operation S133, the storage controller may determine whether an off-cell count exceeding the first discard threshold value is present in the plurality of off-cell counts. When it is determined that an off-cell count exceeding the first discard threshold value is present in the plurality of off-cell counts, the storage controller may perform operation S134. When it is determined that an off-cell count exceeding the first discard threshold value is absent from the plurality of off-cell counts, the storage controller may perform operation S135.

In operation S134, the storage controller may set the fetched page to a read-only mode.

In operation S135, the storage controller may determine a first sector of high reliability and a second sector of low reliability based on the plurality of off-cell counts.

The storage controller may determine that a first sector corresponding to an off-cell count not exceeding the count threshold value from among the plurality of off-cell counts has high reliability. For example, when a first off-cell count among the plurality of off-cell counts does not exceed the count threshold value, the storage controller may determine that a first sector corresponding to the first off-cell count has high reliability.

The storage controller may determine that a second sector corresponding to an off-cell count exceeding the count threshold value from among the plurality of off-cell counts has low reliability. For example, when a second off-cell count among the plurality of off-cell counts exceeds the count threshold value, the storage controller may determine that a second sector corresponding to the second off-cell count has low reliability.

Figure 9:
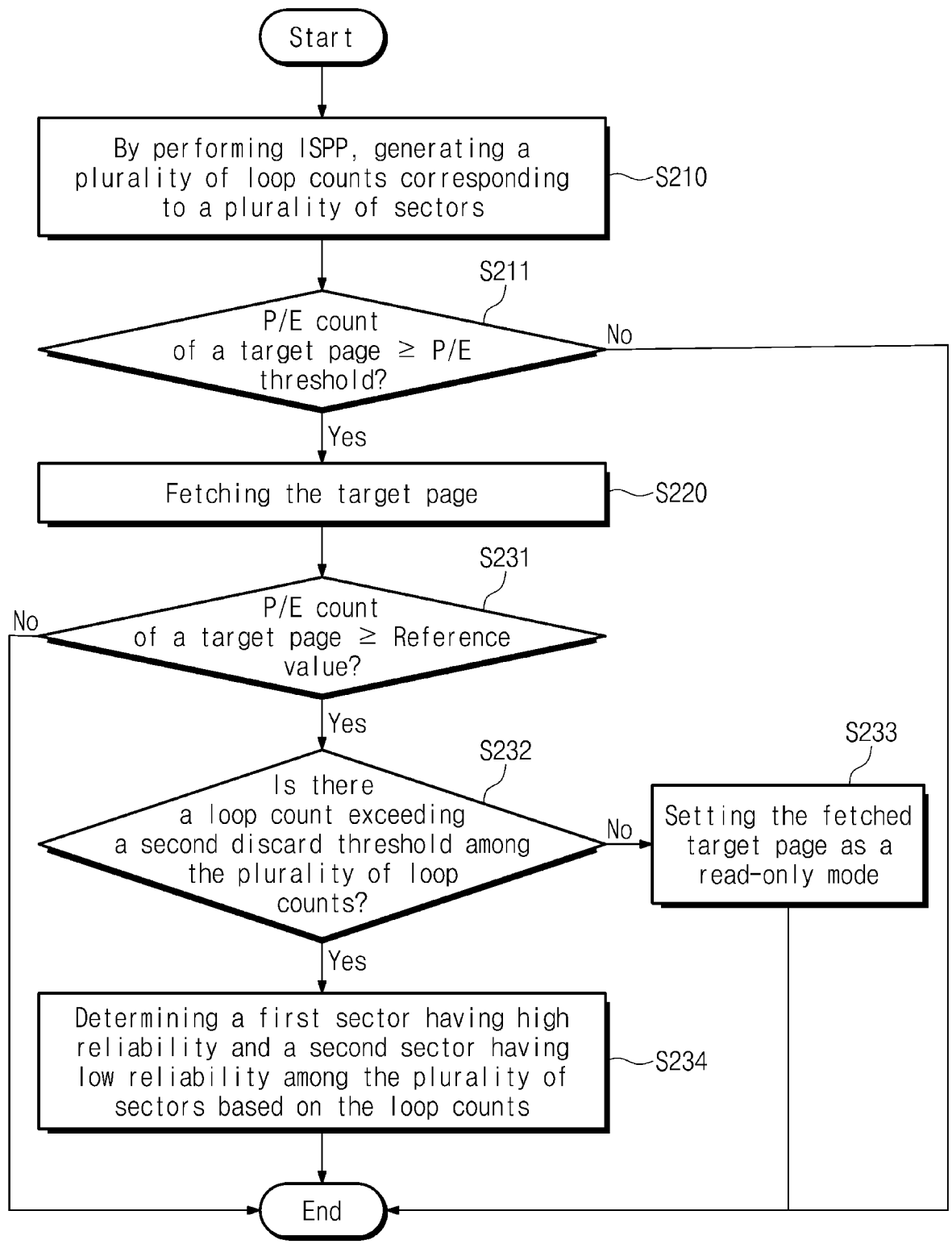
FIG. 9 is a flowchart describing an operation for determining reliability of a sector based on a loop count, according to some example embodiments of the present disclosure.

FIG. 9 is a flowchart describing an operation for determining reliability of a sector based on a loop count, according to some example embodiments of the present disclosure. An operating method of a storage controller according to some example embodiments of the present disclosure will be described with reference to FIG. 9. The storage controller may correspond to the storage controller 110 of FIGS. 1, 2, and 3. Operation S211 and operation S220 may respectively correspond to operation S110 and operation S120 of FIG. 7.

In operation S210, the storage controller may generate a plurality of loop counts respectively corresponding to a plurality of sectors of a target page by performing the ISPP on the target page.

In operation S211, the storage controller may determine whether a P/E count of the target page is greater than or equal to the P/E threshold value. When it is determined that the P/E count of the target page is greater than or equal to the P/E threshold value, the storage controller may perform operation S220. When it is determined that the P/E count of the target page is smaller than the P/E threshold value, the storage controller may not perform the parity management operation.

In operation S220, the storage controller may fetch the target page, based on determining that the P/E count of the target page is greater than or equal to the P/E threshold value.

In operation S231, the storage controller may determine whether the P/E count of the target page is greater than or equal to the reference value. When it is determined that the P/E count of the target page is greater than or equal to the reference value, the storage controller may perform operation S232. When it is determined that the P/E count of the target page is smaller than the reference value, the storage controller may not perform the parity management operation.

In operation S232, the storage controller may determine whether a loop count exceeding the second discard threshold value is present in the plurality of loop counts. When it is determined that a loop count exceeding the second discard threshold value is absent from the plurality of loop counts, the storage controller may perform operation S233. When it is determined that a loop count exceeding the second discard threshold value is present in the plurality of loop counts, the storage controller may perform operation S234.

In operation S233, the storage controller may set the fetched page to a read-only mode.

In operation S234, the storage controller may determine a first sector of high reliability and a second sector of low reliability based on the plurality of loop counts.

The storage controller may determine that a first sector corresponding to a loop count exceeding the loop threshold value from among the plurality of loop counts has high reliability. For example, when a first loop count among the plurality of loop counts exceeds the loop threshold value, the storage controller may determine that a first sector corresponding to the first loop count has high reliability.

The storage controller may determine that a second sector corresponding to a loop count not exceeding the loop threshold value from among the plurality of loop counts has low reliability. For example, when a second loop count among the plurality of loop counts does not exceed the loop threshold value, the storage controller may determine that a second sector corresponding to the second loop count has low reliability.

According to some example embodiments of the present disclosure, a storage controller including a parity management module, a storage device including the same, and an operating method of the storage device are provided.

According to some example embodiments of the present disclosure, as a parity area is again set by the parity management module, the reliability of the storage device may be improved, and the lifetime of the storage device may be prolonged.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A method of operating a storage controller which communicates with a non-volatile memory device, the method comprising:
   determining whether a program/erase (P/E) count of a target page including a plurality of sectors is greater than or equal to a P/E threshold value;
   based on determining that the P/E count of the target page is greater than or equal to the P/E threshold value, fetching the target page;
   determining a first sector having high reliability and a second sector having low reliability from the plurality of sectors of the fetched target page; and
   expanding a second parity area of the second sector by moving a margin region in a first parity area of the first sector to the second parity area of the second sector.

2. The method of claim 1, wherein the expanding of the second parity area further comprises:
   based on the determining the first sector having the high reliability and the second sector having the low reliability, determining whether the P/E count exceeds a reference value; and
   based on determining that the P/E count exceeds the reference value, moving the margin region in the first parity area to the second parity area.

3. The method of claim 2, wherein the reference value is a sum of the P/E threshold value and a variable parameter, and wherein a size of the margin region is determined based on the variable parameter.

4. The method of claim 1, wherein the determining the first sector having the high reliability and the second sector having the low reliability comprises:
obtaining a plurality of off-cell counts respectively corresponding to the plurality of sectors by performing one-shot programming on each of the plurality of sectors;
based on a first off-cell count among the plurality of off-cell counts not exceeding a count threshold value, determining that the first sector corresponding to the first off-cell count has the high reliability; and
based on a second off-cell count among the plurality of off-cell counts exceeding the count threshold value, determining that the second sector corresponding to the second off-cell count has the low reliability.

5. The method of claim 1, wherein the determining the first sector of the high reliability and the second sector of the low reliability comprises:
obtaining a plurality of off-cell counts respectively corresponding to the plurality of sectors by performing one-shot programming on each of the plurality of sectors;
determining whether at least one of the plurality of off-cell counts exceeds a first discard threshold value; and
based on determining that the at least one of the plurality of off-cell counts exceeds the first discard threshold value, setting the fetched target page to a read-only mode.

6. The method of claim 1, wherein the determining whether the P/E count of the target page is greater than or equal to the P/E threshold value comprises:
performing incremental step pulse programming (ISPP) on the target page; and
generating a plurality of loop counts respectively corresponding to the plurality of sectors by performing the ISPP, and
wherein the determining the first sector having the high reliability and the second sector having the low reliability comprises:
based on a first loop count among the plurality of loop counts exceeding a loop threshold value, determining that the first sector corresponding to the first loop count has the high reliability; and
based on a second loop count among the plurality of loop counts not exceeding the loop threshold value, determining that the second sector corresponding to the second loop count has the low reliability.

7. The method of claim 1, wherein the determining whether the P/E count of the target page including the plurality of sectors is greater than or equal to the P/E threshold value comprises:
performing incremental step pulse programming (ISPP) on each of the plurality of sectors; and
generating a plurality of loop counts respectively corresponding to the plurality of sectors by performing the ISPP, and
wherein the determining the first sector having the high reliability and the second sector having the low reliability from the plurality of sectors of the fetched target page comprises:
determining whether at least one of the plurality of loop counts exceeds a second discard threshold value; and
based on determining that the at least one of the plurality of loop counts exceeds the second discard threshold value, setting the fetched target page to a read-only mode.

8. The method of claim 1 further comprising storing the target page in which the second parity area is expanded, in the non-volatile memory device.

9. The method of claim 1 further comprising:
re-fetching the target page in which the second parity area is expanded;
determining a third sector having the high reliability and a fourth sector having the low reliability from the plurality of sectors of the re-fetched target page; and
based on the P/E count of the re-fetched target page exceeding a reference value, expanding a fourth parity area of the fourth sector by moving a second margin region in a third parity area of the third sector to the fourth parity area of the fourth sector.

10. A method of operating a storage device which includes a non-volatile memory device and a storage controller, the method comprising:
determining, by the storage controller, whether a program/erase (P/E) count of a target page including a plurality of sectors is greater than or equal to a P/E threshold value;
based on determining that the P/E count of the target page is greater than or equal to the P/E threshold value, transmitting, by the storage controller, a fetch request for the target page to the non-volatile memory device;
based on receiving the fetch request, fetching, by the non-volatile memory device, the target page to the storage controller;
determining, by the storage controller, a first sector of having high reliability and a second sector having low reliability from the plurality of sectors of the target page that has been fetched; and
expanding, by the storage controller, a second parity area of the second sector by moving a margin region in a first parity area of the first sector to the second parity area of the second sector.

11. The method of claim 10, wherein the expanding the second parity area of the second sector further comprises:
determining, by the storage controller, whether the P/E count exceeds a reference value; and
based on determining that the P/E count exceeds the reference value, moving, by the storage controller, the margin region in the first parity area to the second parity area,
wherein the reference value is a sum of the P/E threshold value and a variable parameter, and
wherein a size of the margin region is determined based on the variable parameter.

12. The method of claim 10 further comprising storing, by the storage controller, the target page in which the second parity area is expanded, in the non-volatile memory device.

13. The method of claim 10 further comprising:
re-fetching, by the non-volatile memory device, the target page in which the second parity area is expanded to the storage controller;
determining, by the storage controller, a third sector having the high reliability and a fourth sector having the low reliability from the plurality of sectors of the target page that has been re-fetched; and
based on the P/E count of the target page that has been re-fetched exceeding a reference value, expanding a fourth parity area of the fourth sector by moving a second margin region in a third parity area of the third sector to the fourth parity area of the fourth sector.

14. A storage device comprising:
a non-volatile memory device configured to store a plurality of pages;
an error correction code (ECC) engine configured to perform error correction of the plurality of pages;
a count table configured to manage program/erase (P/E) counts respectively corresponding to the plurality of pages; and
a parity management module configured to assist the error correction of the ECC engine based on the plurality of P/E counts,
wherein the parity management module is configured to:
determine whether a target P/E count corresponding to a target page is greater than or equal to a target P/E threshold value, with reference to the count table;
based on determining that the P/E count of the target page is greater than or equal to the P/E threshold value, fetch the target page from the non-volatile memory device;
determine a first sector having high reliability and a second sector having low reliability from a plurality of sectors of the fetched target page;
based on determining the first sector having the high reliability and the second sector having the low reliability, expand a second parity area of the second sector by moving a margin region in a first parity area of the first sector to the second parity area of the second sector; and
request the ECC engine to decode the target page in which the second parity area is expanded.

15. The storage device of claim 14, wherein the parity management module is further configured to:
determine whether the P/E count exceeds a reference value; and
based on determining that the P/E count exceeds the reference value, move the margin region in the first parity area to the second parity area.

16. The storage device of claim 15, wherein the reference value is a sum of the P/E threshold value and a variable parameter, and
wherein a size of the margin region is determined based on the variable parameter.

17. The storage device of claim 14, wherein the parity management module is further configured to:
obtain a plurality of off-cell counts respectively corresponding to the plurality of sectors by performing one-shot programming on each of the plurality of sectors;
based on a first off-cell count among the plurality of off-cell counts not exceeding a count threshold value, determine that the first sector corresponding to the first off-cell count has the high reliability; and
based on a second off-cell count among the plurality of off-cell counts exceeding the count threshold value, determine that the second sector corresponding to the second off-cell count has the low reliability.

18. The storage device of claim 17, wherein the parity management module is further configured to:
determine whether at least one of the plurality of off-cell counts exceeds a first discard threshold value; and
based on determining that the at least one of the plurality of off-cell counts exceeds the first discard threshold value, set the fetched target page to a read-only mode.

19. The storage device of claim 14, wherein the parity management module is further configured to:
update the P/E count and generate a plurality of loop counts respectively corresponding to the plurality of sectors, by performing incremental step pulse programming (ISPP) on the target page;
determine whether the updated P/E count of the target page is greater than or equal to the P/E threshold value;
based on determining that the updated P/E count of the target page is greater than or equal to the P/E threshold value, compare a first loop count of the plurality of loop counts with a loop threshold value and compare a second loop count of the plurality of loop counts with the loop threshold value;
based on the first loop count exceeding the loop threshold value, determine that the first sector corresponding to the first loop count has the high reliability; and
based on the second loop count not exceeding the loop threshold value, determine that the second sector corresponding to the second loop count has the low reliability.

20. The storage device of claim 19, wherein the parity management module is further configured to:
determine whether at least one of the plurality of loop counts exceeds a second discard threshold value; and
based on determining that the at least one of the plurality of loop counts does not exceed the second discard threshold value, set the fetched target page to a read-only mode.

* * * * *